(12) United States Patent
Belyansky et al.

(10) Patent No.: US 7,648,871 B2
(45) Date of Patent: Jan. 19, 2010

(54) FIELD EFFECT TRANSISTORS (FETS) WITH INVERTED SOURCE/DRAIN METALLIC CONTACTS, AND METHOD OF FABRICATING SAME

(75) Inventors: Michael P. Belyansky, Bethel, CT (US); Dureseti Chidambarrao, Weston, CT (US); Lawrence A. Clevenger, Lagrangeville, NY (US); Kaushik A. Kumar, Beacon, NY (US); Carl Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 11/163,523

(22) Filed: Oct. 21, 2005

(65) Prior Publication Data
US 2007/0092990 A1   Apr. 26, 2007

(51) Int. Cl.
H01L 21/8238 (2006.01)

(52) U.S. Cl. .......... 438/216; 438/624; 438/625; 438/525; 438/629; 438/630; 438/634; 438/637; 438/638; 438/680; 257/288; 257/382; 257/383; 257/384; 257/385

(58) Field of Classification Search ........... 257/288; 438/680
See application file for complete search history.

(56) References Cited

U.S. PATENT DOCUMENTS

| | | | | |
|---|---|---|---|---|
| 4,599,790 A | * | 7/1986 | Kim et al. | 438/182 |
| 4,675,715 A | * | 6/1987 | Lepselter et al. | 257/51 |
| 5,112,763 A | * | 5/1992 | Taylor et al. | 438/577 |
| 5,118,382 A | * | 6/1992 | Cronin et al. | 438/740 |
| 5,254,490 A | * | 10/1993 | Kondo | 438/297 |
| 5,328,553 A | * | 7/1994 | Poon | 438/633 |
| 5,470,768 A | * | 11/1995 | Yanai et al. | 438/161 |
| 5,654,218 A | * | 8/1997 | Lee | 438/301 |
| 5,677,210 A | * | 10/1997 | Park et al. | 438/300 |
| 6,042,975 A | * | 3/2000 | Burm et al. | 430/22 |
| 6,083,845 A | * | 7/2000 | Yang et al. | 438/734 |
| 6,096,590 A | * | 8/2000 | Chan et al. | 438/233 |
| 6,103,619 A | * | 8/2000 | Lai | 438/638 |
| 6,121,648 A | * | 9/2000 | Evans, Jr. | 257/295 |

(Continued)

OTHER PUBLICATIONS

K. Shenai et al., "Selectively Silicided Vertical Power Double-Diffused Metal-Oxide Semiconductor Field Effect Transistors for High-Frequency Power Switching Applications", Journal of Vacuum Science & Technology B, vol. 6, No. 6, Nov./Dec. 1988, pp. 1740-1745.

Primary Examiner—N Drew Richards
Assistant Examiner—Ankush K Singal
(74) Attorney, Agent, or Firm—Scully, Scott, Murphy & Presser, P.C; Joseph P. Abate, Esq.

(57) ABSTRACT

The present invention relates to an field effect transistor (FET) comprising an inverted source/drain metallic contact that has a lower portion located in a first, lower dielectric layer and an upper portion located in a second, upper dielectric layer. The lower portion of the inverted source/drain metallic contact has a larger cross-sectional area than the upper portion. Preferably, the lower portion of the inverted source/drain metallic contact has a cross-sectional area ranging from about 0.03 μm² to about 3.15 μm², and such an inverted source/drain metallic contact is spaced apart from a gate electrode of the FET by a distance ranging from about 0.001 μm to about 5 μm.

20 Claims, 5 Drawing Sheets

U.S. PATENT DOCUMENTS

| | | |
|---|---|---|
| 6,130,482 A | 10/2000 | Iio et al. |
| 6,139,995 A * | 10/2000 | Burm et al. .................... 430/22 |
| 6,188,098 B1 * | 2/2001 | Amanuma ................. 257/306 |
| 6,228,729 B1 * | 5/2001 | Ni ............................. 438/300 |
| 6,274,468 B1 * | 8/2001 | Hsu ........................... 438/586 |
| 6,495,434 B1 | 12/2002 | Rhodes |
| 6,593,217 B1 | 7/2003 | Fujisawa |
| 6,767,811 B2 | 7/2004 | Rhodes |
| 2002/0031901 A1 | 3/2002 | Sadjadi et al. |
| 2002/0173096 A1 | 11/2002 | Okudaira |
| 2004/0063289 A1 | 4/2004 | Ohta |
| 2004/0113212 A1 | 6/2004 | Lee et al. |
| 2004/0155269 A1 | 8/2004 | Yelehanka et al. |
| 2004/0175877 A1 | 9/2004 | Lin et al. |
| 2004/0203215 A1 | 10/2004 | Tsai et al. |
| 2004/0214390 A1 | 10/2004 | Chen et al. |
| 2004/0245583 A1 | 12/2004 | Horiuchi et al. |
| 2007/0170433 A1 * | 7/2007 | Son et al. ....................... 257/67 |

\* cited by examiner

FIG. 7 ary plane
FIELD EFFECT TRANSISTORS (FETS) WITH INVERTED SOURCE/DRAIN METALLIC CONTACTS, AND METHOD OF FABRICATING SAME

FIELD OF THE INVENTION

The present invention relates to an improved field effect transistor (FET), and more particularly to an improved metal-oxide-semiconductor field-effect transistor (MOSFET) having an inverted source/drain metallic contact, and methods for fabricating such an FET device.

BACKGROUND OF THE INVENTION

In the semiconductor industry, there is a constant demand to increase the operating speed of integrated circuits (ICs). This increased demand is fueled by the need for electronic devices such as computers to operate at increasingly greater speeds. The demand for increased speed, in turn, has resulted in a continual size reduction of the semiconductor devices. Specifically, the channel length, junction depths, and/or gate dielectric thickness of field effect transistors (FETs) are reduced, which leads to increased density and number of FETS that can be fabricated on a given single semiconductor wafer.

However, the aggressive scaling or size reduction of the FETs also raises various technical issues relating to contact spacing and parasitic capacitance, which need to be addressed in order to meet the requirements for both device performance and manufacturing yield.

SUMMARY OF THE INVENTION

The present invention provides a solution to the contact spacing and parasitic capacitance issues by constructing an improved FET design. The improved FET design of the present invention is advantageously characterized by: (1) reduced number of source/drain (S/D) metal contacts, (2) reduced total contact layout area, (3) substantially the same effective contact area, (4) increased contact-to-gate distance, and (5) reduced gate-to-contact capacitance, in comparison with conventional FET designs. Further, the improved FET of the present invention is relatively easier to manufacture than the conventional FETs and can be fabricated at significantly increased product yield with reduced manufacturing costs.

The present invention, in one aspect, relates to a semiconductor device comprising:
  a channel region located between a source region and a drain region;
  a gate dielectric layer located over the channel region;
  a gate electrode located over the gate dielectric layer;
  a first dielectric layer located over and covering the source region, the drain region, and the gate electrode;
  a second dielectric layer located over the first dielectric layer; and
  at least one metallic contact electrically connected to either the source or the drain region, wherein the at least one metallic contact comprises a lower portion that is located in the first dielectric layer and an upper portion that is located in the second dielectric layer, and wherein the lower portion has a larger cross-sectional area than the upper portion.

The term "metallic" as used herein refers to a structure or component that is formed essentially of a conductive material containing at least one metal in an elemental form, an alloy form, or a compound form. Examples of such conductive material include, but are not limited to: elemental metals, metal alloys, metal nitrides, metal silicides, etc.

The term "cross-sectional area" as used herein refers to an area of a structure or component as cut by an imaginary plane that is substantially parallel to the surface of a semiconductor substrate upon which the structure or component is located.

A further aspect of the present invention relates to a method comprising:
  forming a semiconductor device that comprises a source region, a drain region, a channel region, a gate dielectric layer located over the channel region, a gate electrode located over the gate dielectric layer, a first dielectric layer located over and covering the source region, the drain region, and the gate electrode, and a second dielectric layer located over the first dielectric layer;
  selectively removing a portion of the first and second dielectric layers to form at least one contact hole that exposes either the source region or the drain region;
  selectively removing a portion of the first dielectric layer along a sidewall of the at least one contact hole; and
  filling the at least one contact hole with a metallic material to form at least one metallic contact that is electrically connected to either the source or the drain region, wherein the at least one metallic contact comprises a lower portion that is located in the first dielectric layer and an upper portion that is located in the second dielectric layer, and wherein the lower portion has a larger cross-sectional area than the upper portion.

A still further aspect of the present invention relates to a field effect transistor (FET) comprising an inverted source/drain metallic contact that has a lower portion located in a first, lower dielectric layer and an upper portion located in a second, upper dielectric layer, and wherein the lower portion of the inverted source/drain metallic contact has a larger cross-sectional area than the upper portion thereof.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The improved FET device of the present invention as well as exemplary processing steps for fabricating the same will now be described in greater detail by referring to the accompanying FIGS. 1-7. Note that in these drawings, which are not drawn to scale, like and/or corresponding elements are referred to by like reference numerals. It is further noted that in the drawings only one FET is shown on a semiconductor substrate. Although illustration is made to such an embodiment, the present invention is not limited to the formation of any specific number of FETs on the semiconductor substrate.

Figure 1A:
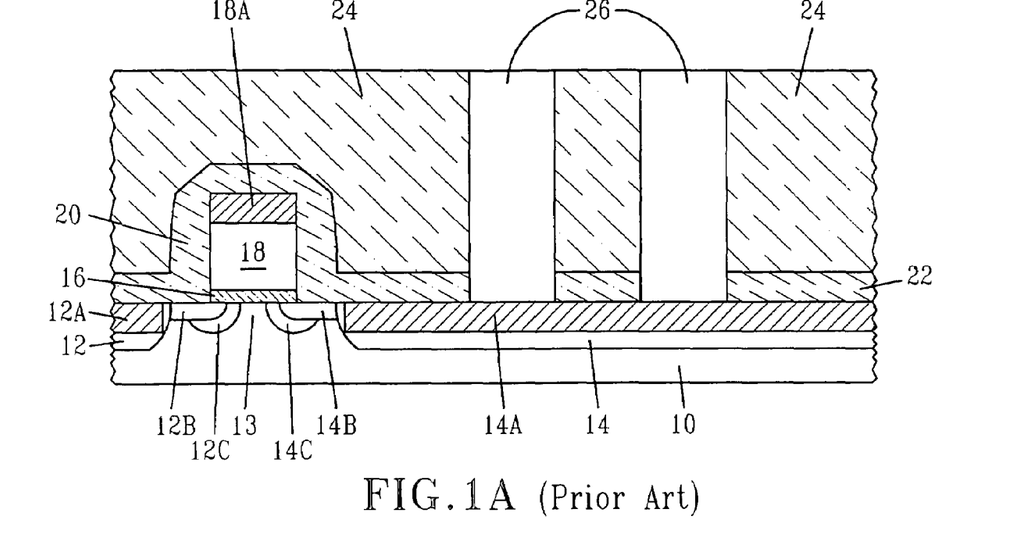
FIG. 1A shows a cross-sectional view of a conventional FET device containing multiple source/drain metallic contacts.

Reference is first made to FIG. 1A, which shows a conventional FET device located on a semiconductor substrate 10 and comprising source (or drain) region 12 and drain (or source) region 14, which define a channel region 13 therebetween. A gate dielectric layer 16 is located directly over the channel region 13, and a gate electrode 18 is located directly over the gate dielectric layer 18. The conventional FET device may further comprise source (or drain) metal silicide contact layer 12A, drain (or source) metal silicide contact layer 14A, gate metal silicide contact layer 18A, source/drain extension regions 12B and 14B, source/drain halo regions 12C and 14C, and one or more gate sidewall spacers 20, which are optional to the conventional FET device.

The conventional FET device as shown in FIG. 1A is covered by a first dielectric layer 22 and a second dielectric layer 24, which can be formed of either the same or different dielectric materials. Multiple metallic contacts 26 extend through the first and second dielectric layers 22 and 24 and are electrically connected with the drain (or source) metal silicide contact layer 14A in the drain (or source) region 14. Each of the metallic contacts 26 of the conventional FET device is characterized by a substantially uniform cross-sectional area through its entire contact height.

Figure 1B:
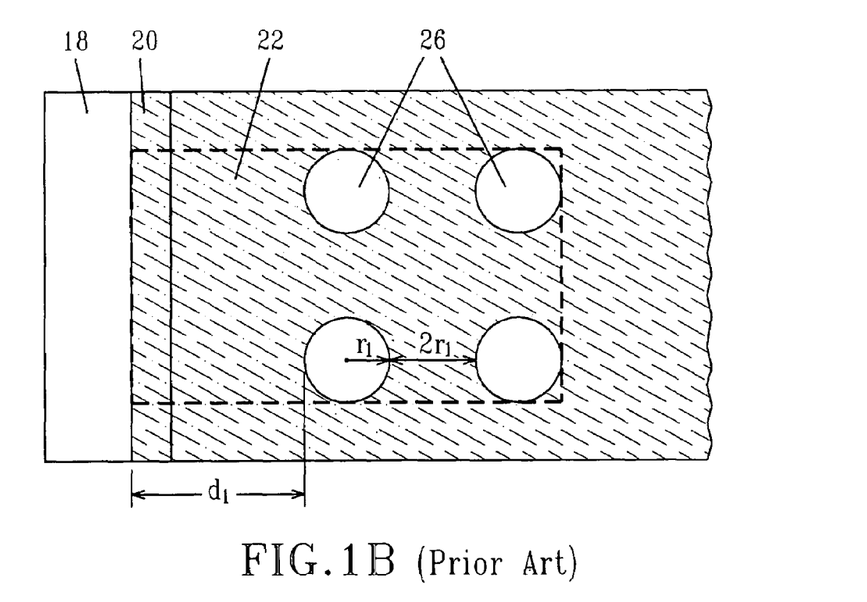
FIG. 1B is a top view of the conventional FET device of FIG. 1A, showing four source/drain metallic contacts spaced apart from one another. Each source/drain metallic contact has the same cross-sectional area throughout the entire contact height.

FIG. 1B shows a top view of the conventional FET device of FIG. 1A, with the second dielectric layer 24 removed so as to expose the first dielectric layer 22, the spacer 20, and the gate electrode 18. Specifically, the conventional FET device contains four metallic contacts 26, each of which has a cross-sectional diameter ($r_1$), which ranges from about 0.05 μm to about 0.5 μm. The four metallic contacts 26 are spaced apart from one another by a distance of at least about twice of their cross-sectional diameter, i.e., $2r_1$. Further, these four metallic contacts 26 are spaced apart from the gate electrode 18 by a distance ($d_1$) of at least 0.001 μm.

The total effective contact area of the conventional FET device shown in FIGS. 1A and 1B, which is calculated as the number of metallic contacts 26 times the cross-sectional area of each metallic contact 26 ($=4\pi r_1^2$), therefore ranges from about 0.03 μm² to about 3.15 μm². The total layout area consumed by the four metallic contacts 26, which is the area indicated by the dotted-line box in FIG. 1B ($=(d_1+6r_1)\times 6r_1$), ranges from about 0.09 μm² to about 9 μm².

Figure 2A:
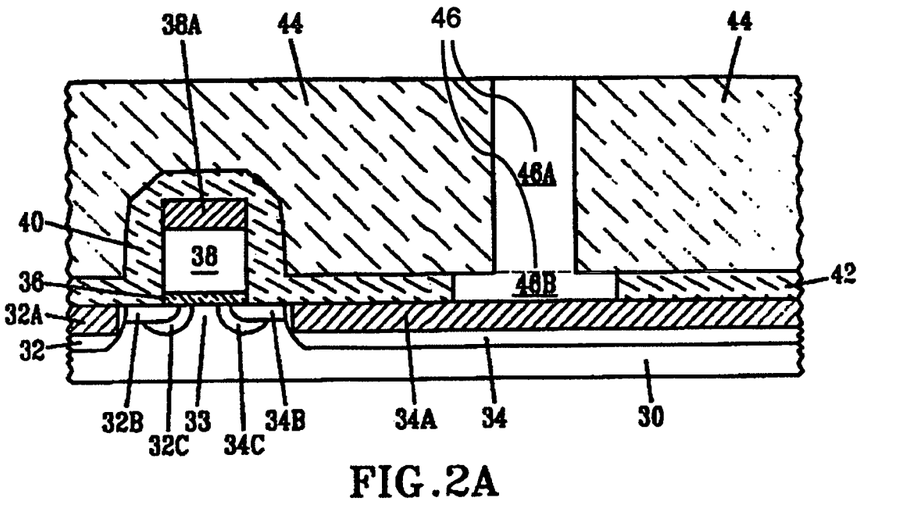
FIG. 2A shows a cross-sectional view of an exemplary FET device that contains one inverted source/drain metallic contact, according to one embodiment of the present invention.

In contrast to the conventional FED device described hereinabove, FIG. 2A shows an improved FET device according to one embodiment of the present invention. Specifically, the improved FET device of the present invention is located on a semiconductor substrate 30 and comprises source (or drain) region 32 and drain (or source) region 34, which define a channel region 33 therebetween. A gate dielectric layer 36 is located directly over the channel region 33, and a gate electrode 38 is located directly over the gate dielectric layer 38. The improved FET device of the present invention may further comprise source (or drain) metal silicide contact layer 32A, drain (or source) metal silicide contact layer 34A, gate metal silicide contact layer 38A, source/drain extension regions 32B and 34B, source/drain halo regions 32C and 34C, and one or more gate sidewall spacers 40, which are optional to the improved FET device of the present invention. A first dielectric layer 42 and a second dielectric layer 44, which may comprise either the same or different dielectric materials, are formed over the improved FET device of the present invention.

A metallic contact comprising an upper portion 46A and a lower portion 46B extend through the first and second dielectric layers 42 and 44, respectively, and is electrically connected with the drain (or source) metal silicide contact layer 34A in the drain (or source) region 34. The lower portion 46B of such a metallic contact has a larger cross-sectional area than the upper portion 46A. Therefore, the metallic contact is characterized by an inverted T-shape and is hereby referred to as an "inverted" metallic contact.

Figure 2B:
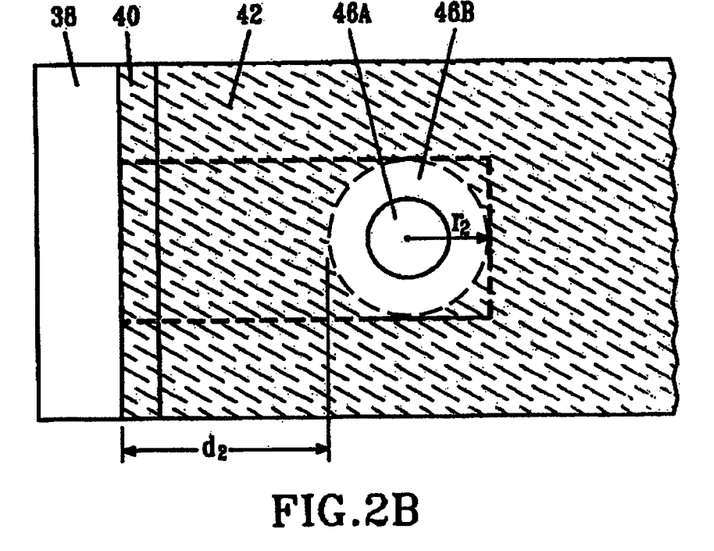
FIG. 2B is a top view of the exemplary FET device of FIG. 2A showing one source/drain metallic contact with a relatively larger cross-sectional area at a lower portion and a relatively smaller cross-sectional area at an upper portion.

FIG. 2B shows a top view of the improved FET device of the present invention, with the second dielectric layer 44 removed so as to expose the first dielectric layer 42, the spacer 40, and the gate electrode 38. Specifically, the improved FET device contains a single metallic contact having an upper portion 46A of a relatively small cross-sectional area and a lower portion 46B of a relatively large cross-sectional area. Preferably, the lower portion 46B of the single metallic contact has a cross-sectional diameter ($r_2$) that ranges from about 0.10 μm to about 1.0 μm, while the upper portion 46A has a cross-sectional diameter that is not more than half of $r_2$. Further, the metallic contact is spaced apart from the gate electrode 38 by a distance ($d_2$) of at least 0.001 μm.

The total effective contact area of the improved FET device of the present invention, which is calculated as the cross-sectional area of the metallic contact 46 ($=\pi r_2^2$), therefore ranges from about 0.03 μm² to about 3.15 μm². The total layout area consumed by the metallic contact 46 of the present invention, which is the area indicated by the dotted-line box in FIG. 2B ($=(d_2+2r_2)\times 2r_2$), ranges from about 0.04 μm² to about 4.0 μm².

When $r_2=2r_1$, the total effective contact area of the improved FET device of the present invention will be substantially the same as that of the conventional FET device. However, the total layout area consumed by the metallic contact 46 is significantly smaller than, by about $20r_1^2$ or from about 0.05 μm² to about 5 μm², that of the conventional FET device, if assuming $d_2=3/2 d_1$.

The FET device of the present invention allows use of a reduced number of S/D metal contacts and provides substantially the same effective contact area within a reduced total contact layout area. More importantly, the FET device of the present invention allows the S/D metal contacts to be spaced further away from the gate electrode (i.e., by at least ½ $d_1$ or from about 0.0002 μm to about 2 μm), which in turn reduces the gate-to-contact capacitance, without increasing the total contact layout area.

Therefore, the FET device of the present invention solves the contact spacing problem and the parasitic capacitance problem typically associated with aggressive scaling or size reduction of the FETs and allows fabrication of smaller and faster high performance integrated circuit (IC) devices at reduced costs.

While the embodiment of the invention as specifically illustrated in FIGS. 2A and 2B employs only one source/drain metallic contact 46, it is understood that the present invention can be easily extended to include any number of source/drain metallic contacts, as long as the total number of source/drain metallic contacts contained in the FET device of the present invention is less than that in the conventional FET device.

The FET device of the present invention can be readily fabricated by any suitable method. Specifically, FIGS. 3-7 illustrate a sequence of exemplary processing steps that can be used for fabricating the FET device of the present invention.

Figure 3:
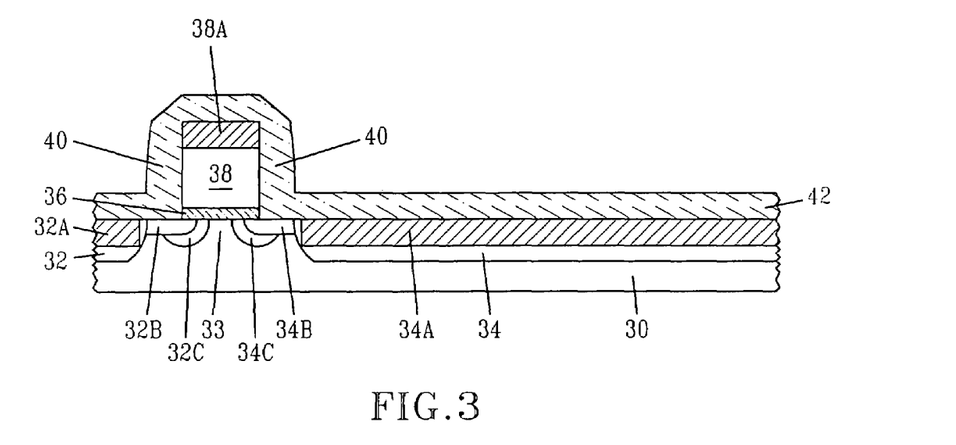
FIGS. 3-7 show cross sectional views that illustrate the processing steps for forming the exemplary FET device of FIG. 2A.

FIG. 3 shows an FET device located on a semiconductor substrate 30 and comprises a source (or drain) region 32, a drain (or source) region 34, a channel region 33, a gate dielectric layer 36, and a gate electrode 38. The FET device optionally, but not necessarily, comprises: source (or drain) metal silicide contact layer 32A, drain (or source) metal silicide contact layer 34A, gate metal silicide contact layer 38A, source/drain extension regions 32B and 34B, source/drain halo regions 32C and 34C, and one or more gate sidewall spacers 40. The FET device can be readily formed by conventional front-end-of-line (FEOL) processing steps. For example, various processing steps, including but not limited to: deposition, lithography, etching, implantation, and self-aligned silicidation, can be used, or a replacement gate process can be used.

The semiconductor substrate 30 may comprise any semiconductor material including, but not limited to: Si, SiC, SiGe, SiGeC, Ge alloys, GaAs, InAs, InP, as well as other III-V or II-VI compound semiconductors. The semiconductor substrate 30 may also comprise an organic semiconductor structure, a layered semiconductor structure such as Si/SiGe, a silicon-on-insulator structure or a SiGe-on-insulator structure. The semiconductor substrate 30 may be doped, undoped, or contain doped and undoped regions therein (not shown). The doped device regions are typically known as "wells". The semiconductor substrate 30 may be strained, unstrained, or contain regions of strained and unstrained semiconductor materials therein. Moreover, the semiconductor substrate 30 may have a single crystallographic surface orientation or multiple crystallographic surface orientations.

Further, the semiconductor substrate 30 may contain one or more shallow trench isolation regions (not shown) to provide isolation between doped device regions. The shallow trench isolation regions can be readily formed utilizing a conventional trench isolation process well known to those skilled in the art. For example, lithography, etching and filling of the trench with a trench dielectric may be used in forming the trench isolation region.

A first dielectric layer 42 is formed over the FET device, as shown in FIG. 3. The first dielectric layer 42 may comprise any suitable dielectric material(s), including, but not limited to: $SiO_x$, $Si_xN_y$, $Si_xN_yO_z$, $Si_xC_y$, $Si_xC_yO_z$, etc., wherein x, y, and z are integers. Further, the first dielectric layer 42 can be formed by any suitable dielectric deposition processes, including, but not limited to: high-density plasma deposition (HDP), plasma-enhanced chemical vapor deposition (PECVD), etc. Preferably, the first dielectric layer 42 is formed by an HDP process.

Figure 4:
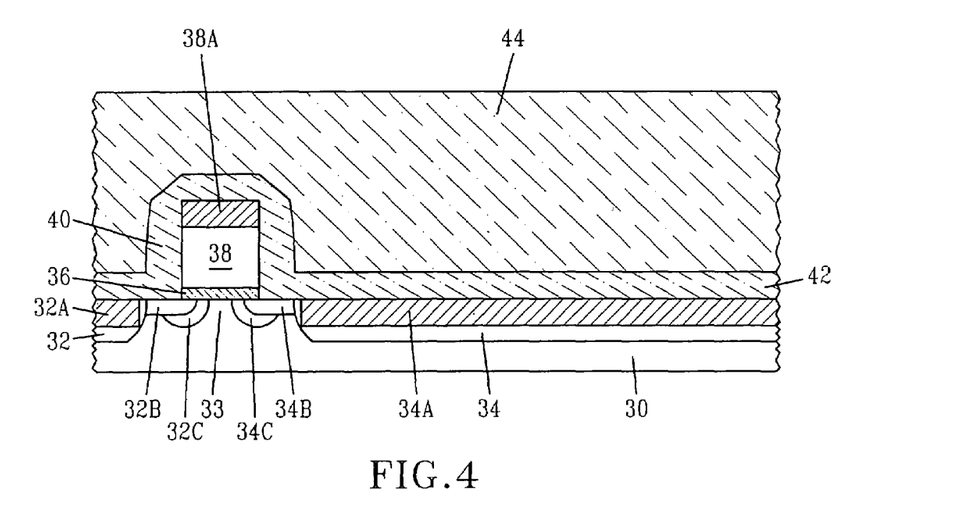

Subsequently, a second dielectric layer 44 is formed over the first dielectric layer 42, as shown in FIG. 4. The first dielectric layer 42 may comprise any suitable dielectric material(s), including, but not limited to: $SiO_x$, $Si_xN_y$, $Si_xN_yO_z$, $Si_xC_y$, $Si_xC_yO_z$, etc., wherein x, y, and z are integers, and it preferably comprises a different dielectric material from that of the first dielectric layer 42. More preferably, the second dielectric layer 44 comprises $SiO_x$. Further, the second dielectric layer 44 can be formed by any suitable dielectric deposition processes, including, but not limited to: high-density plasma deposition (HDP), plasma-enhanced chemical vapor deposition (PECVD), etc. Preferably, the second dielectric layer 42 is formed by an HDP process.

Figure 5:
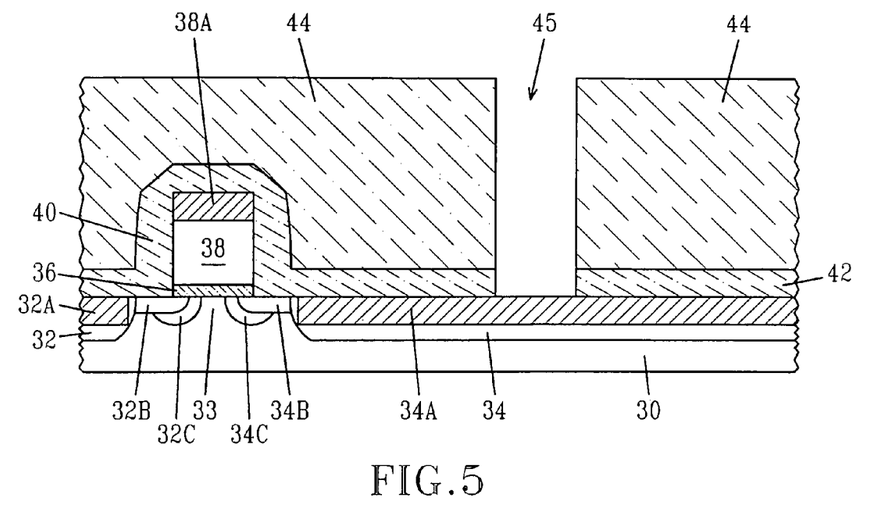

After deposition of the second dielectric layer 44, a portion of the first and second dielectric layers 42 and 44 are selectively removed, for example, by photolithography and etching, to form a contact hole 45 that exposes an upper surface of the drain (or source) metal silicide contact layer 34A in the drain (or source) region 34. Specifically, a photoresist (not shown) is applied to the entire structure over the second dielectric layer 44. The photoresist can be applied by any suitable technique, including, but not limited to: coating or spin-on techniques. A mask (not shown), which is patterned with the shape of the contact hole to be formed, is provided over the photoresist, and the mask pattern is transferred to the photoresist using a photolithographic process, which creates recesses in the uncovered regions of the photoresist. The patterned photoresist is subsequently used to create the same pattern of recesses in the first and second dielectric layers 42 and 44, using a reactive ion etching (RIE) process or any other suitable dry or wet etching techniques. The photoresist is subsequently stripped after formation of the contact hole 45, as shown in FIG. 5.

Figure 6:
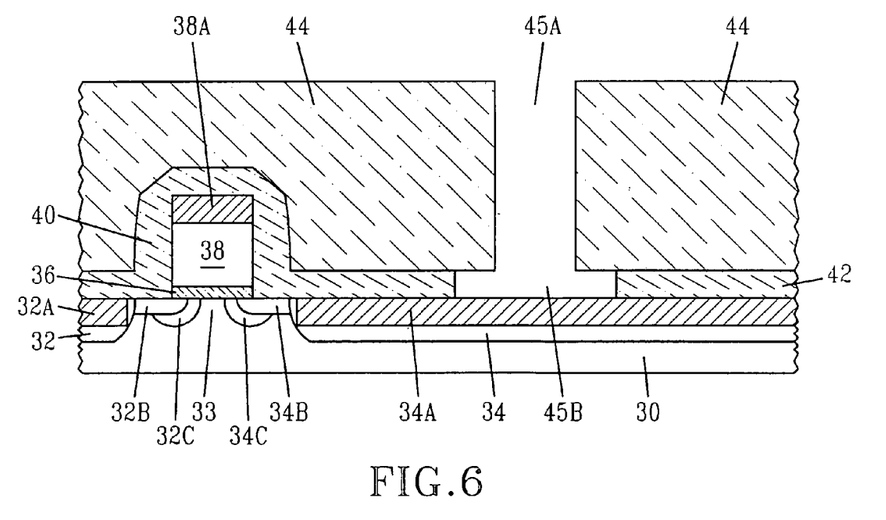

Next, a second etching step is carried out to selectively etch the first dielectric layer 42 along a sidewall of the contact hole 45 in a lateral direction, thereby expanding the contact hole 45 sideways into the first dielectric layer 42 and forming a narrower, upper portion 45A and a wider, lower portion 45B, as shown in FIG. 2D. For example if the first dielectric layer 42 comprises $SiO_2$ and the second dielectric layer 44 comprises $Si_3N_4$, then a dilute HF exposure can be used to selectively etch out the $SiO_2$ in the first dielectric layer 42 from the $Si_3N_4$ in the second dielectric layer 44.

Figure 7:
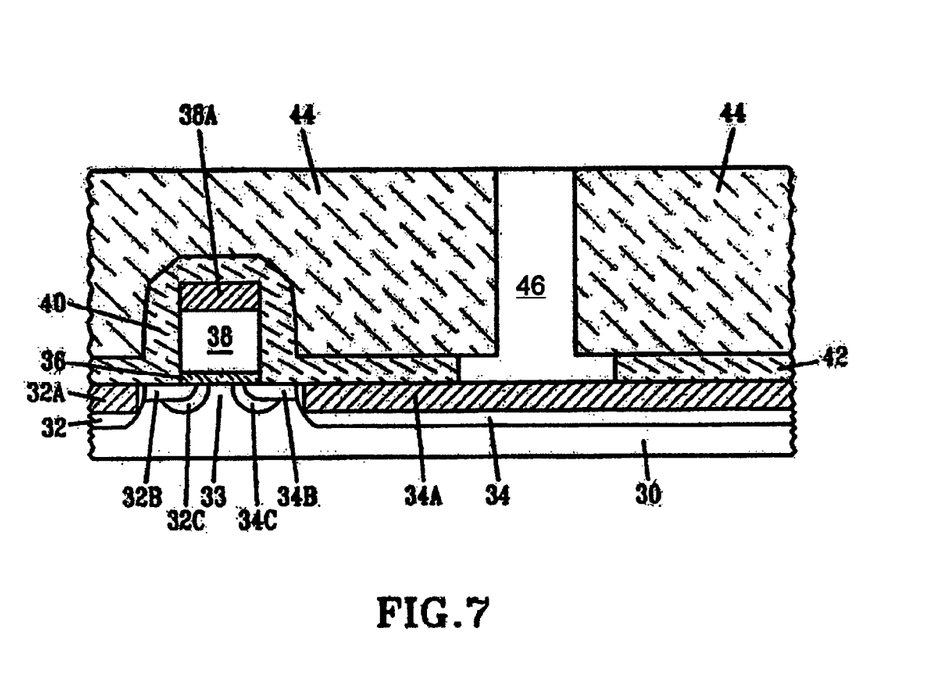

After formation of the expanded contact hole 45, a metallic material is deposited into the expanded contact hole 45 to form an inverted source/drain metallic contact with an integral upper portion 46A of a relatively small cross-sectional area and a lower portion 46B of a relatively large cross-sectional area, as shown in FIG. 7. Preferably, but not necessarily, the lower portion 46B of the inverted source/drain metallic contact of the present invention has a cross-sectional area ranging from about 0.0314 μm² to about 3.14 μm², while the upper portion 46A has a cross-sectional area ranging from about 0.008 μm² to about 0.79 μm². Any suitable metallic material may be employed in the practice of the present invention, including, but not limited to: W, Al, Cu, Ag, Au, and alloys, silicides, and nitrides thereof. In a preferred embodiment of the present invention, W is used as the metallic material for forming the inverted source/drain metallic contact of the present invention.

The processing steps described hereinabove therefore form an improved FET device with an inverted source/drain metallic contact, which is characterized by a reduced total layout area, which ranges from about 0.05 μm² to about 5 μm², and a reduced gate-to-contact capacitance, which is less than about 0.3 femtoFarads per micron of channel width.

In summary, the present invention fulfills the need for further scaling of FETs in fabricating high speed, high performance IC devices at relatively lower costs.

While FIGS. 2-7 illustratively demonstrates an exemplary FET structure and exemplary processing steps for fabricating same, according to a specific embodiment of the present invention, it is clear that a person ordinarily skilled in the art can readily modify the device structure and the process steps illustrated herein, for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A semiconductor device comprising:
a channel region located between a source region and a drain region;
a gate dielectric layer located over the channel region;
a gate electrode located over the gate dielectric layer;
a first dielectric layer located over and covering the source region, the drain region, and the gate electrode;
a second dielectric layer located over the first dielectric layer; and
at least one metallic contact electrically connected to either the source or the drain region, wherein said at least one metallic contact comprises a lower portion that is located in the first dielectric layer and an upper portion that is located in the second dielectric layer, and wherein the lower portion has a larger cross-sectional area than the upper portion, and wherein the lower portion and the upper portion are of integral construction without a physically manifested interface, and wherein a horizontal cross-sectional area of said lower portion and a horizontal cross-sectional area of said upper portion are concentric circles having different diameters.

2. The semiconductor device of claim 1, comprising only one metallic contact that is electrically connected to either the source or the drain region.

3. The semiconductor device of claim 1, wherein the lower portion of the at least metallic contact has a cross-sectional area ranging from about $0.03\ \mu m^2$ to about $3.15\ \mu m^2$.

4. The semiconductor device of claim 1, wherein the upper portion of the at least metallic contact has a cross-sectional area ranging from about $0.015\ \mu m^2$ to about $3.15\ \mu m^2$.

5. The semiconductor device of claim 1, wherein the at least one metallic contact is spaced apart from the gate electrode by a distance ranging from about $0.001\ \mu m$ to about $5\ \mu m$.

6. The semiconductor device of claim 1, having a gate-to-contact capacitance of less than about 0.3 femtoFarads per micron of channel width.

7. The semiconductor device of claim 1, wherein the at least one metallic contact comprises W, Al, Cu, Ag, Au, or a combination thereof.

8. The semiconductor device of claim 1, wherein the first dielectric layer comprises $SiO_x$, $Si_xN_y$, $Si_xN_yO_z$, $Si_xC_y$, $Si_xC_yO_z$, or a combination thereof, wherein x, y, and z are integers.

9. The semiconductor device of claim 1, wherein the second dielectric layer comprises $SiO_x$, $Si_xN_y$, $Si_xN_yO_z$, $Si_xC_y$, $Si_xC_yO_z$, or a combination thereof, wherein x, y, and z are integers.

10. The semiconductor device of claim 1, further comprising one or more components selected from the group consisting of source/drain extension implants, source/drain halo implants, source/drain/gate contacts, and gate sidewall spacers.

11. A semiconductor device comprising:
a channel region located between a source region and a drain region;
a gate dielectric layer located over said channel region;
a gate electrode located over said gate dielectric layer;
a first dielectric layer located over and covering said source region, said drain region, and said gate electrode;
a second dielectric layer located over said first dielectric layer; and
at least one metallic contact electrically connected to either said source or said drain region, wherein said at least one metallic contact comprises a lower portion that is located in said first dielectric layer and an upper portion that is located in said second dielectric layer, and wherein said lower portion has a larger cross-sectional area than said upper portion, and wherein a boundary between said lower portion and said upper portion and a boundary between said first dielectric layer and said second dielectric layer are at the same height, and wherein said lower portion and said upper portion are of integral construction without a physically manifested interface, and wherein a horizontal cross-sectional area of said lower portion and a horizontal cross-sectional area of said upper portion are concentric circles having different diameters.

12. The semiconductor device of claim 11, comprising only one metallic contact that is electrically connected to either the source or the drain region.

13. The semiconductor device of claim 11, wherein the lower portion of the at least metallic contact has a cross-sectional area ranging from about $0.03\ \mu m^2$ to about $3.15\ \mu m^2$.

14. The semiconductor device of claim 11, wherein the upper portion of the at least metallic contact has a cross-sectional area ranging from about $0.015\ \mu m^2$ to about $3.15\ \mu m^2$.

15. The semiconductor device of claim 11, wherein the at least one metallic contact is spaced apart from the gate electrode by a distance ranging from about $0.001\ \mu m$ to about $5\ \mu m$.

16. A semiconductor device comprising:
a channel region located between a source region and a drain region;
a gate dielectric layer located over said channel region;
a gate electrode located over said gate dielectric layer;
a first dielectric layer located over and covering said source region, said drain region, and said gate electrode;
a second dielectric layer located over said first dielectric layer; and
at least one metallic contact electrically connected to either said source or said drain region, wherein said at least one metallic contact comprises a lower portion and an upper portion vertically abutting said lower portion, and wherein said lower portion is located in said first dielectric layer and has a first horizontal cross-sectional area bounded by a first periphery, and said upper portion is located in said second dielectric layer and has a second horizontal cross-sectional area bounded by a second periphery, and wherein said first horizontal cross-sectional area is greater than said second horizontal cross-sectional area, and said first periphery is self-aligned to said second periphery with substantially equal distance between said first periphery and said second periphery in a top-down view, and wherein no portion of said first periphery overlap said second periphery in said top-down view.

17. The semiconductor device of claim 16, wherein a boundary between said lower portion and said upper portion and a boundary between said first dielectric layer and said second dielectric layer are at the same height.

18. The semiconductor device of claim 16, wherein said first periphery is substantially a first circle having a first radius, and wherein said second periphery is substantially a second circle having a second radius, wherein said first circle and said second circle are concentric.

19. The semiconductor device of claim 18, wherein a boundary between said lower portion and said upper portion and a boundary between said first dielectric layer and said second dielectric layer are at the same height.

20. The semiconductor device of claim 16, wherein the at least one metallic contact comprises W, Al, Cu, Ag, Au, or a combination thereof.

* * * * *